(12) United States Patent
Wang et al.

(10) Patent No.: US 9,863,841 B2
(45) Date of Patent: Jan. 9, 2018

(54) MEASURING DEVICE HAVING IDEAL WAVEFRONT GENERATOR FOR DETECTING POINT DIFFRACTION INTERFEROMETRIC WAVEFRONT ABERRATION OF MEASURED OPTICAL SYSTEM AND METHOD FOR DETECTING WAVEFRONT ABERRATION THEREOF

(71) Applicant: Shanghai Institute of Optics And Fine Mechanics, Chinese Academy of Sciences, Shanghai (CN)

(72) Inventors: Xiangzhao Wang, Shanghai (CN); Feng Tang, Shanghai (CN); Guoxian Zhang, Shanghai (CN); Shifu Xu, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 101 days.

(21) Appl. No.: 14/986,560

(22) Filed: Dec. 31, 2015

(65) Prior Publication Data

US 2017/0184455 A1    Jun. 29, 2017

(30) Foreign Application Priority Data

Dec. 24, 2015  (CN) .......................... 2015 1 0982270

(51) Int. Cl.
*G01M 11/02* (2006.01)
*G03F 7/20* (2006.01)
*G01J 9/02* (2006.01)

(52) U.S. Cl.
CPC ....... *G01M 11/0271* (2013.01); *G01J 9/0215* (2013.01); *G03F 7/706* (2013.01);
(Continued)

(58) Field of Classification Search
CPC .................. G03F 7/70591; G03F 7/706; G01J 2009/0269; G01J 9/02; G01J 9/0215;
(Continued)

(56) References Cited

U.S. PATENT DOCUMENTS

| 6,559,952 B1 * | 5/2003 | Bokor | ..................... G03F 7/706 |
| | | | 356/515 |
| 2004/0174532 A1 * | 9/2004 | Nakauchi | .................. G01J 9/02 |
| | | | 356/515 |

(Continued)

FOREIGN PATENT DOCUMENTS

CN    201310126148.5 A    8/2013

OTHER PUBLICATIONS

U.S. Appl. No. 14/986,593, filed Dec. 31, 2015, Tang et al.

*Primary Examiner* — Michael P Lapage
(74) *Attorney, Agent, or Firm* — Mei & Mark LLP; Manni Li (57) ABSTRACT

A point diffraction interferometric wavefront aberration measuring device comprising an optical source, an optical splitter, a first light intensity and polarization regulator, a phase shifter, a second light intensity and polarization regulator, an ideal wavefront generator, an object precision adjusting stage, a measured optical system, an image wavefront detection unit, an image precision adjusting stage, and a data processing unit. The center distance between the first output port and the second output port of the ideal wavefront generator is smaller than the diameter of the isoplanatic region of the measured optical system and is greater than the ratio of the diameter of the image point dispersion speckle of the measured optical system over the amplification factor thereof. A method for detecting wavefront aberration of the optical system is also provided by using the device.

20 Claims, 9 Drawing Sheets

(52) U.S. Cl.
CPC ............. *G01J 2009/0223* (2013.01); *G01J 2009/0226* (2013.01); *G01J 2009/0265* (2013.01)

(58) Field of Classification Search
CPC ....... G01J 2009/0265; G01J 2009/0226; G01J 2009/0223; G01N 21/45; G01M 11/0257; G01M 11/0242; G01M 11/0271
See application file for complete search history.

(56) References Cited

U.S. PATENT DOCUMENTS

| | | | | |
|---|---|---|---|---|
| 2006/0104181 | A1* | 5/2006 | Tabuchi | G11B 7/08582 369/112.01 |
| 2006/0262323 | A1* | 11/2006 | Yamamoto | G03F 7/706 356/515 |
| 2007/0019175 | A1* | 1/2007 | Ohsaki | G01M 11/02 355/55 |
| 2008/0259349 | A1* | 10/2008 | Ando | G03F 7/706 356/512 |
| 2010/0309448 | A1* | 12/2010 | Yamamoto | G01B 11/2441 355/53 |

\* cited by examiner

MEASURING DEVICE HAVING IDEAL WAVEFRONT GENERATOR FOR DETECTING POINT DIFFRACTION INTERFEROMETRIC WAVEFRONT ABERRATION OF MEASURED OPTICAL SYSTEM AND METHOD FOR DETECTING WAVEFRONT ABERRATION THEREOF

CROSS-REFERENCE AND RELATED APPLICATION

The subject application claims priority on Chinese patent application CN 201510982270.1 filed on Dec. 24, 2015. The contents and subject matters of the priority application is incorporated herein by reference.

FIELD OF INVENTION

The present invention relates to interferometry, particularly, a point diffraction interferometric wavefront aberration measuring device and a method for detecting wavefront aberration of the optical system thereof.

BACKGROUND ART

Wavefront aberration is an importance parameter in depicting properties of a small-aberration imaging optical system. Wavefront aberration of a high quality microscopic objective or a spatial telescope needs to be smaller than $\lambda/4$ PV or $\lambda/14$ RMS (where $\lambda$ is an operating wavelength, and RMS is a root mean square value). Wavefront aberration of a deep UV lithographic projection lens needs to be in a few nm RMS, while that of an EUV needs to be less than 1 nm RMS, which demands for wavefront aberration techniques.

China Patent Application No. 201310126148.5A to Tang et al. discloses a point diffraction interferometric wavefront aberration measuring device and a detecting method where two standard spherical waves are generated on an object plane of a measured optical system, and the light intensity, polarization states, and optical path difference thereof are adjustable for producing high interference visibility, and the measured results are able to eliminate the system errors. Nevertheless, in the case the photoelectric sensor in the image wavefront detection unit is just a two-dimensional detector without replaceable optical lens, the technique results in a loss of interference data in certain regions of the periphery of the numerical aperture of the measured optical system, thus elimination of the system error for a complete numerical aperture is impossible. Additionally, the measuring procedure is too complex. Moreover, when the wavefront aberration of the measured optical system is very small, the technical system error of the current technology is far greater than the wavefront aberration of the measured optical system. Thus, the detection result is greatly influenced by the random noise of the system, and multiple measurements are required and then averaged to increase detection precision.

SUMMARY OF THE INVENTION

The present invention overcomes the defects of the current technology by providing a device for measuring point diffraction interferometric wavefront aberration and a method for detecting wavefront aberration of the optical system thereof, so as to realize high precision detection of the wavefront aberration of the optical system thereof. The measuring device has simple detecting steps, with the measuring procedure being advantageous to have an average effect and little random noise influence. In addition, no loss of interference data exists on the periphery of the numerical aperture of the measured optical system, and calibration and elimination of the system errors may be realized for a complete numerical aperture.

The device for measuring a point diffraction interferometric wavefront aberration of the present invention comprises an optical source, an optical splitter, a first light intensity and polarization regulator, a phase shifter, a second light intensity and polarization regulator, an ideal wavefront generator, an object precision adjusting stage, a measured optical system, an image wavefront detection unit, an image precision adjusting stage, and a data processing unit; the ideal wavefront generator is an optical component transforming a light inputted from a first input port and a second input port thereof to a standard spherical wave in a scope of an object numerical aperture of the measured optical system which is subsequently outputted respectively from a first output port and a second output port thereof; the characteristics is that the center distance $s_o$ between the first output port and the second output port of the ideal wavefront generator is smaller than the diameter of the isoplanatic region of the measured optical system and is greater than the ratio of the diameter of the image point dispersion speckle of the measured optical system over the amplification factor thereof.

The present invention further provides a method for detection employing the device for measuring the point diffraction interferometric wavefront aberration of the optical system, which comprises the following steps:

1) moving the object precision adjusting stage so that the first output port or the second output port of the ideal wavefront generator is situated in a position of a field of view point for detection of the measured optical system;

2) moving the image precision adjusting stage and conducting a precision alignment, so that an image point of the first output port of the ideal wavefront generator is aligned with the center of the filtering circular hole of an image mask, and an image point of the second output port is situated inside a transmittance band of the image mask;

3) adjusting the first light intensity and polarization regulator and the second light intensity and polarization regulator, so that the intensity of the interferogram collected by a photoelectric sensor reaches 0.6-0.9 of the saturation intensity of the photoelectric sensor, and the interference visibility thereof reaches above 0.6; phase shifting for a phase shift phase $\delta$ via the phase shifter, with the photoelectric sensor collecting an interferogram, phase shifting for a second time for a phase shift phase $\delta$ via the phase shifter, with the photoelectric sensor collecting another interferogram, repeating for m times to obtain a sequence of m interferograms: Ia1, Ia2, . . . , Iam; conducting phase extraction and phase-unwrapping on the sequence of the m interferograms to obtain a phase distribution $W_a$;

4) moving the image precision adjusting stage and conducting a precision alignment, so that the image point of the second output port of the ideal wavefront generator is aligned with the center of the filtering circular hole of the image mask, and the image point of the first output port is situated inside the transmittance band of the image mask;

5) adjusting the first light intensity and polarization regulator and the second light intensity and polarization regulator, so that the intensity the interferogram collected by the photoelectric sensor reaches 0.6-0.9 of the saturation intensity of the photoelectric sensor, and the interference visibility thereof reaches above 0.6; phase shifting for a phase shift phase δ for m times via the phase shifter, with each time the photoelectric sensor collecting an interferogram, to obtain a sequence of m interferograms: Ib1, Ib2, . . . , Ibm; conducting phase extraction and phase-unwrapping on the sequence of the m interferograms Ib1, Ib2, . . . , Ibm to obtain a phase distribution $W_b$;

6) calculating the wave aberration W of the measured optical system at the field of view point via the expression $W=\frac{1}{2}(W_a-W_b)$, and calculating the system error of the point diffraction interferometric wavefront aberration measuring device via the expression $W_{sys}=\frac{1}{2}(W_a+W_b)$.

The present invention is advantageous in the following aspects:

(1) the detection result is capable of calibrating and eliminating system errors of the measured optical system in a scope of complete numerical aperture;

(2) the measuring method has an average effect and is capable of obtaining higher measurement precision and repeatability;

(3) the detection steps are simple.

BRIEF DESCRIPTION OF THE DRAWINGS

FIG. 2 has multiple schematic diagrams showing the first light intensity and polarization regulator of the present invention, among which, FIG. 2(a) is a schematic diagram showing the first embodiment of the first light intensity and polarization regulator of the present invention; FIG. 2(b) is a schematic diagram showing the second embodiment of the first light intensity and polarization regulator of the present invention; FIG. 2(c) is a schematic diagram showing the third embodiment of the first light intensity and polarization regulator of the present invention; FIG. 2(d) is a schematic diagram showing the fourth embodiment of the first light intensity and polarization regulator of the present invention.

FIG. 3 has schematic diagrams showing the phase shifter of the present invention, among which, FIG. 3(a) is a schematic diagram showing the first embodiment of the phase shifter of the present invention; FIG. 3(b) is a schematic diagram showing the second embodiment of the phase shifter of the present invention.

FIG. 8 has multiple schematic diagrams showing the image wavefront detection unit of the present invention, among which.

FIG. 9 has multiple schematic diagrams showing the image mask of the present invention, among which, FIG. 9(a) is a schematic diagram showing the first embodiment of the image mask of the present invention; FIG. 9(b) is a schematic diagram showing the second embodiment of the image mask of the present invention; FIG. 9(c) is a schematic diagram showing the third embodiment of the image mask of the present invention; FIG. 9(d) is a schematic diagram showing the fourth embodiment of the image mask of the present invention.

DETAILED DESCRIPTION OF THE INVENTION AND EMBODIMENTS

In combination with drawings and embodiments hereunder provided, the present invention is further enunciated, but shall not be thereby restricted in respect of the scope of protection thereof.

Figure 1:
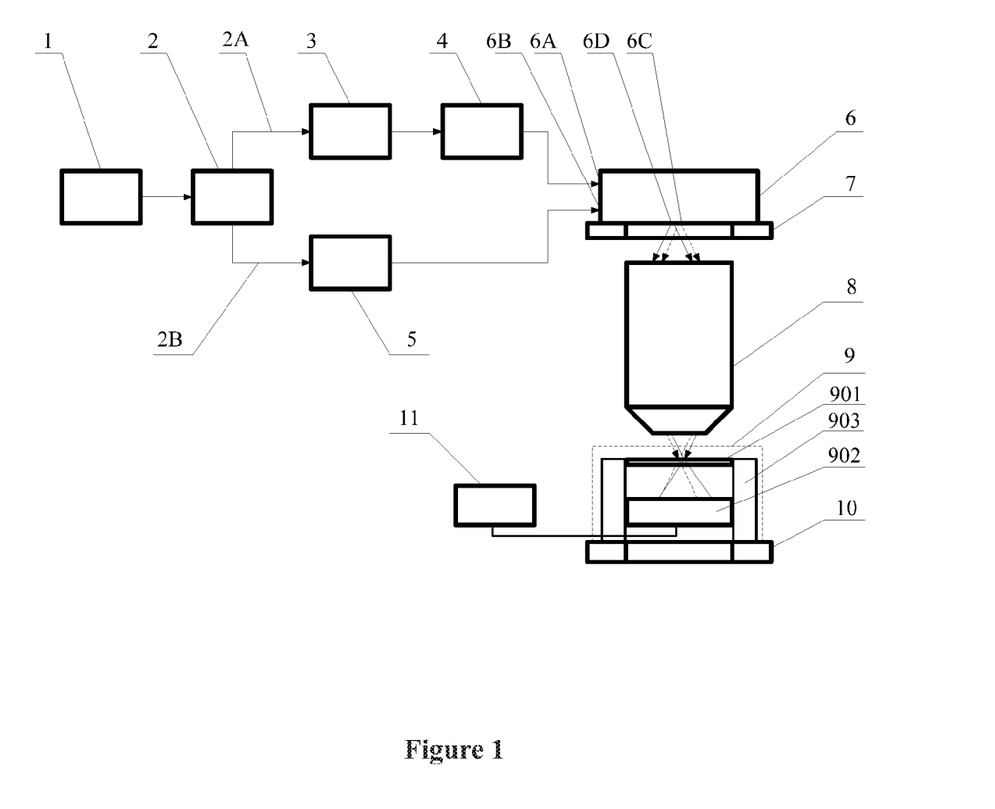
FIG. 1 is a schematic diagram of the point diffraction interferometric wavefront aberration measuring device of the present invention.

As shown on FIG. 1, the device for measuring point diffraction interferometric wavefront aberration of the present invention comprises an optical source 1, an optical splitter 2, a first light intensity and polarization regulator 3, a phase shifter 4, a second light intensity and polarization regulator 5, an ideal wavefront generator 6, an object precision adjusting stage 7, a measured optical system 8, an image wavefront detection unit 9, an image precision adjusting stage 10, and a data processing unit 11. The image wavefront detection unit 9 is composed of an image mask 901, a photoelectric sensor 902, and a support 903; the image mask 901 comprises a transmittance band 901b and a filtering circular hole 901a (which might be in plural, such as a first filtering circular hole 901a1, and a second filtering circular hole 901a2); the photoelectric sensor comprises a two-dimensional detector 902b; the center distance $s_o$ between the first output port 6C and the second output port 6D of the ideal wavefront generator 6 is smaller than the diameter of the isoplanatic region of the measured optical system 8 and is greater than the ratio of the diameter of the image point dispersion speckle of the measured optical system 8 over the amplification factor of the measured optical system 8.

The positions of the above components and the interconnections thereamong are as follows: along the advancing direction of the path of the output light of the optical source 1 is the optical splitter 2; the optical splitter 2 splits an incident light into two paths, a light path adjustable light path 2A and a light-path-fixed light path 2B; along the light path adjustable light path 2A are connected the first light intensity and polarization regulator 3, the phase shifter 4, and is subsequently connected a first input port 6A of the ideal wavefront generator 6, where the first light intensity and polarization regulator 3 is placed prior to or subsequent to the phase shifter 4; along the light-path-fixed light path 2B is arranged the second light intensity and polarization regulator 5, and subsequently is connected a second input port 6B of the ideal wavefront generator 6; the first output port 6C and the second output port 6D of the ideal wavefront generator 6 are on an object plane of the measured optical system 8; the ideal wavefront generator 6 is supported and precision positioned by the object precision adjusting stage 7; the image wavefront detection unit 9 is situated on the image side of the measured optical system 8, the image mask 901 of the image wavefront detection unit 9 is situated on an image plane of the measured optical system 8, and the two-dimensional detector 902b of the photoelectric sensor 902 is situated subsequent to the image mask 901 along the advancing direction of the light; the image wavefront detection unit 9 is supported and precision positioned by the image precision adjusting stage 10; the output signal of the image wavefront detection unit 9 is inputted to the data processing unit 11.

The working principle and working process of the present invention is as follows:

The output light of the light source 1 is split via the optical splitter 2 into two paths, the light path adjustable light path 2A and the light-path-fixed light path 2B; the light passing along the light path adjustable light path 2A and the light-path-fixed light path 2B generates respectively on the first output port 6C or the second output port 6D of the ideal wavefront generator 6 a standard spherical wave; the object precision adjusting stage 7 adjusts the first output port 6C or the second output port 6D of the ideal wavefront generator 6 to a position of the field of view point for detection in the object field of view of the measured optical system 8; the center distance $s_o$ between the first output port 6C and the second output port 6D of the ideal wavefront generator 6 is smaller than the diameter of the isoplanatic region of the measured optical system 8, and thus the measured optical system 8 has an identical wavefront aberration on the field of view points of the first output port 6C and the second output port 6D of the ideal wavefront generator 6, which is the wavefront aberration W to be detected, that is to say, the measured optical system 8 generates an identical wavefront distortion W on both field of view points; a standard spherical wave has no wavefront aberration, that is, the wavefront aberration of a standard spherical wave Ws=0, and hence the two standard spherical waves passing though the measured optical system 8 generate an identical wavefront distortion, and both the wavefront aberrations are equal to the wavefront aberration W to be measured.

Move the image precision adjusting stage 10 so that an image point of the first output port 6C of the ideal wavefront generator 6 is aligned with the center of the filtering circular hole of an image mask 901, and an image point of the second output port 6D is situated inside a transmittance band 901b of the image mask 901; the wavefront penetrating the filtering circular hole 901a is standard spherical wave once again, with a wavefront aberration being Ws=0; the wavefront passing through the transmittance band 901b undergoes no change, with the wavefront aberration remaining equal to the wavefront aberration for detection W; the free space and optical components in-between the image mask 901 and the two-dimensional detector 902b introduce an interferometric system error $W_{sys}$ to the two wavefronts of the image mask 901; with the mutual interference between the two wavefronts, the phase distribution $W_a$ carried by the interferogram is as shown in expression (1):

$$W_a = W - W_S + W_{SYS} = W + W_{SYS} \qquad (1)$$

Move the image precision adjusting stage 10 so that the image point of the second output port 6D of the ideal wavefront generator 6 is aligned with the center of the filtering circular hole 901a of the image mask 901, and the image point of the first output port 6C is situated inside the transmittance band 901b of the image mask 901; the wavefront penetrating the filtering circular hole 901a is a standard spherical wave once again, with a wavefront aberration being Ws=0; the wavefront passing through the transmittance band 901b undergoes no change, with the wavefront aberration remaining equal to the wavefront aberration for detection W; the free space and optical components in-between the image mask 901 and the two-dimensional detector 902b introduce an interferometric system error $W_{sys}$ to the two wavefronts of the image mask 901; with the mutual interference between the two wavefronts, the phase distribution $W_b$ carried by the interferogram is shown in expression (2):

$$W_b = W_S - W + W_{SYS} = -W + W_{SYS} \qquad (2)$$

Thus, the wave aberration W of the measured optical system 8 at the field of view point may be calculated via the expression $W = \frac{1}{2}(W_a - W_b)$, and the system error of the point diffraction interferometric wavefront aberration measuring device may be calculated via the expression $W_{sys} = \frac{1}{2}(W_a + W_b)$. The measured wavefront aberration is equivalent to an average value of two measurements, and hence higher measurement precision and repeatability is obtained.

As the two wavefronts passing through the image mask 901 come respectively from the light path adjustable light path 2A and the light-path-fixed light path 2B, by adjusting the first light intensity and polarization regulator 3 on the light path adjustable light path 2A, the light intensity and polarization of one wavefront may be regulated, by adjusting the second light intensity and polarization regulator 5 on the light-path-fixed light path 2B, the light intensity and polarization of another wavefront may be regulated; when the polarization and light intensity of the two wavefronts are respectively equal one to another, the interference visibility arrives at its maximum value 1; when the polarization of the two wavefronts are both linearly polarized, and the polarization directions are perpendicular one to another, no interference takes place, and the interference visibility is 0; when the two wavefronts have identical polarization, with the light intensity of one wavefront being $I_{w1}$, the light intensity of the other one being $I_{w2}$, the interference visibility η is shown in expression (3):

$$\eta = \frac{2\sqrt{I_{w1} I_{w2}}}{I_{w1} + I_{w2}} \qquad (3)$$

Hence, by adjusting the first light intensity and polarization regulator 3 and the second light intensity and polarization regulator 5, a higher interference visibility is realized.

Also as the two wavefronts passing through the image mask 901 come respectively from the light path adjustable light path 2A and the light-path-fixed light path 2B, by adjusting the light path of the light path adjustable light path 2A via the phase shifter, the phase of one wave front changes and generates a phase shift, and thus high precision detection is realized by means of phase shift interferometry.

Figure 2:
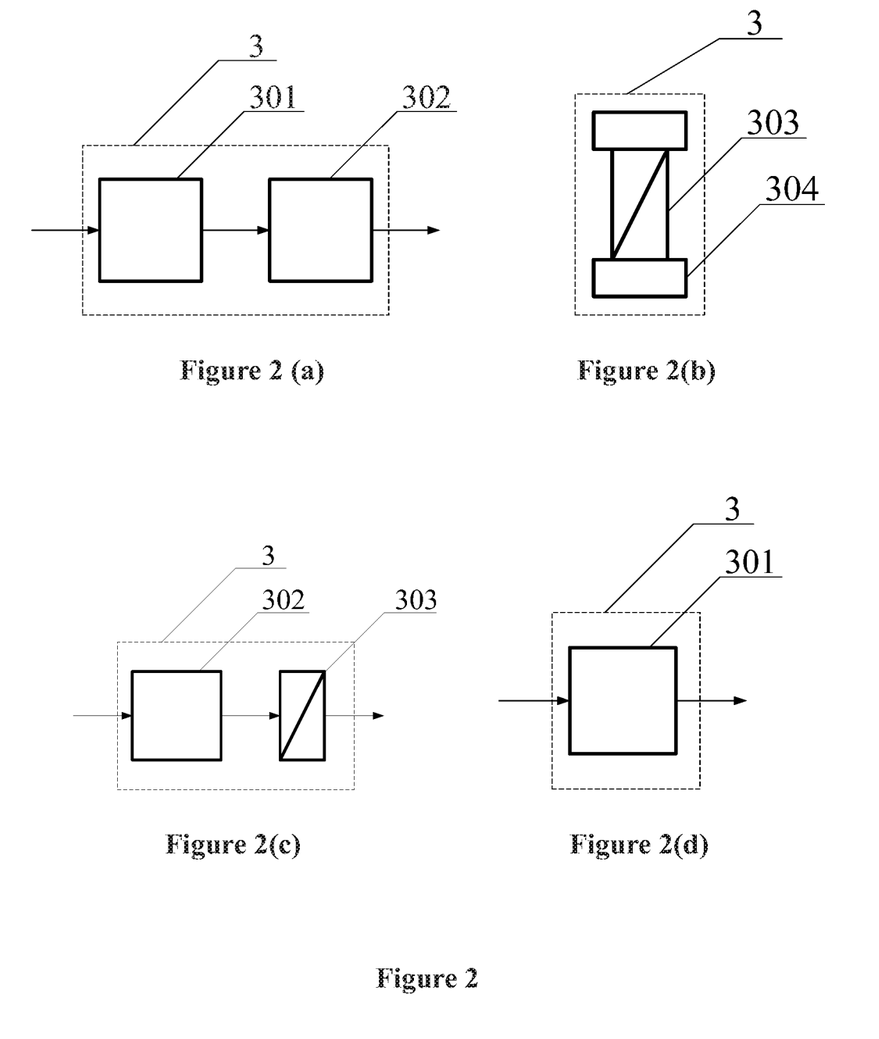

FIG. 2 has multiple schematic diagrams showing multiple embodiments of the first light intensity and polarization regulator 3 of the present invention. The first light intensity and polarization regulator 3 as is shown on FIG. 2(a) is composed of an adjustable attenuator 301 and a polarization controller 302; the adjustable attenuator 301 is connected prior to or subsequent to the polarization controller 302 along the advancing direction of light.

The first light intensity and polarization regulator 3 as is shown on FIG. 2(b) is composed of a polarization analyzer 303 and a rotary stage 304; the rotary stage 304 rotates the polarization analyzer 303 to change the direction of the transmission axis of the polarization analyzer 303, thereby changing the polarization and light intensity of the output light.

The first light intensity and polarization regulator 3 as is shown on FIG. 2(*c*) is composed of a polarization controller 302 and a polarization analyzer 303; the polarization controller 302 and the polarization analyzer 30 are successively connected along the advancing direction of light; by adjusting the polarization of light via the polarization controller 302, the light intensity of the polarization analyzer 303 is changed.

The first light intensity and polarization regulator 3 as is shown on FIG. 2(*d*) is an adjustable attenuator 301, and only adjusts light power along the light path.

The second light intensity and polarization regulator 5 might adopt a structure identical to, or different from, that of the first light intensity and polarization regulator 3.

Figures 3, 3A, 3B:
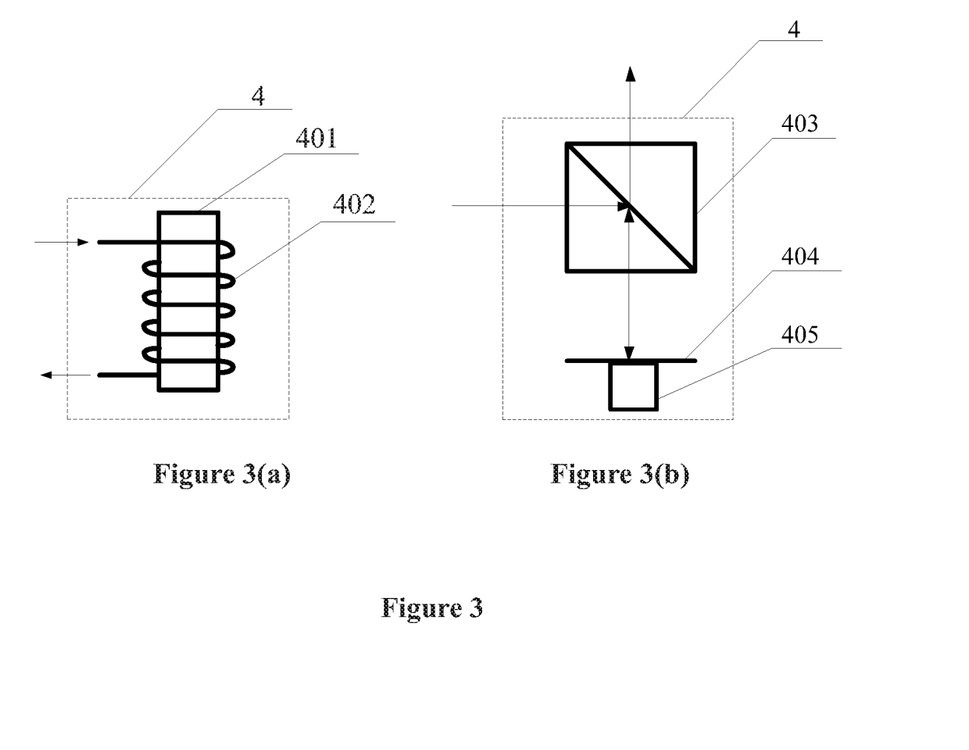

FIG. 3 has two schematic diagrams showing two embodiments of the phase shifter 4 of the present invention. The phase shifter 4 as shown on FIG. 3(*a*) is composed of a columnar piezoelectric ceramic 401 and a single-mode fiber loop 402 winding thereon; by changing the driving voltage of the columnar piezoelectric ceramic 401, the diameter of the columnar piezoelectric ceramic 401 changes, thus the length of the single-mode fiber loop 402 and thereby the light path is changed.

The phase shifter 4 as shown on FIG. 3(*b*) is composed of a beam splitter prism 403, a reflector 404, and a piezoelectric ceramic 405; along the direction of the incident light is arranged the beam splitter prism 403, and the reflector 404 is arranged in the direction of the reflection light of the beam splitter prism; light reflected by the reflector 404 comes out via the beam splitter prism 403; as the reflector 404 is mounted on the piezoelectric ceramic 405, by changing the driving voltage of the piezoelectric ceramic 405, the length of the piezoelectric ceramic 405 is changed to move the reflector 404, thus changing the light path.

Figure 4:
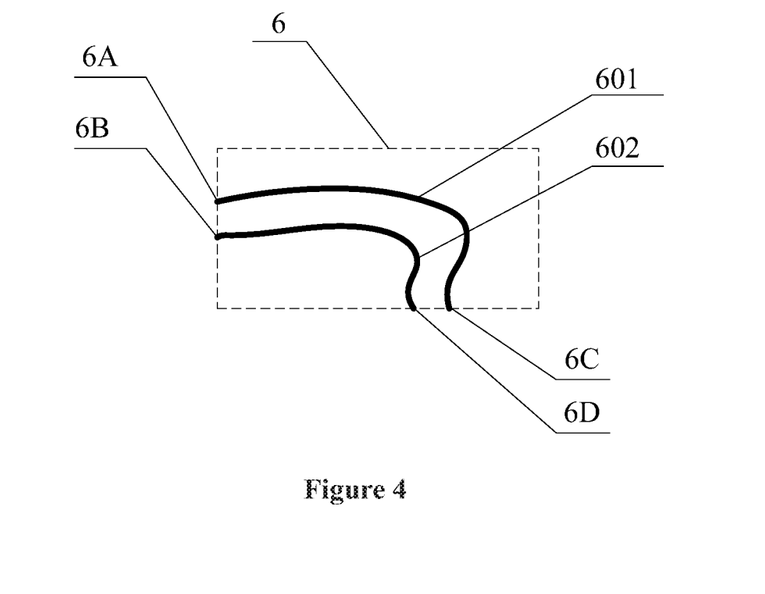
FIG. 4 is a schematic diagram showing the first embodiment of the ideal wavefront generator of the present invention.

FIG. 4 is a schematic diagram of the first embodiment of the ideal wavefront generator 6 of the present invention. As is shown on FIG. 4, the first embodiment of the ideal wavefront generator 6 is composed of a first fiber 601 and a second fiber 602; the input port of the first fiber is the first input port 6A of the ideal wavefront generator 6, while the output port thereof is the first output port 6C of the ideal wavefront generator 6; the input port of the second fiber is the second input port 6B of the ideal wavefront generator 6, while the output port thereof is the second output port 6D of the ideal wavefront generator 6; the first fiber 601 and the second fiber 602 are single-mode fibers, the first fiber 601 and the second fiber 602 may also be polarization maintaining fibers; the fiber core diameter $\Phi_f$ of the output port of either the first fiber 601 or of the second fiber 602 is smaller than the object diffraction limited resolution of the measured optical system 8, and satisfying $\Phi_f < \lambda/(2NA_o)$, wherein $\lambda$ is the wavelength of the light source, and $NA_o$ is the object numerical aperture of the measured optical system 8. Since the first fiber 601 and the second fiber 602 is each either a single-mode fiber or a polarization maintaining fiber, there is only one transmission mode in the fiber, and since the fiber core diameter $\Phi_f$ of each of their output port is smaller than the object diffraction limited resolution of the measured optical system 8, their output light fields are each a standard spherical wave within the object numerical aperture $NA_o$ of the measured optical system 8, with the input light of the first input port 6A or the second input port 6B being transformed into a standard spherical wave and being outputted from the first output port 6C or the second output port 6D respectively. The center distance between the fiber cores of the output ports of the first fiber 601 and the second fiber 602 is smaller than the diameter of the isoplanatic region of the measured optical system 8, and is greater than the ratio of the diameter of the image point dispersion speckle of the measured optical system 8 over the amplification factor thereof. For example, the diameter of the image point dispersion speckle of the measured optical system 8 being 1 μm, the diameter of the isoplanatic region being 300 μm, and the amplification factor being 1/5, then the center distance between the fiber cores of the output ports of the first fiber 601 and the second fiber 602 is smaller than 300 μm, and is greater than 5 μm.

Figure 5:
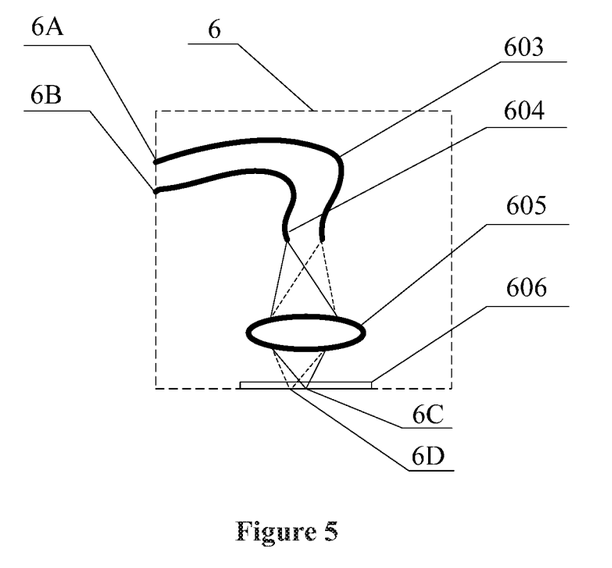
FIG. 5 is a schematic diagram showing the second embodiment of the ideal wavefront generator of the present invention.
Figure 6:
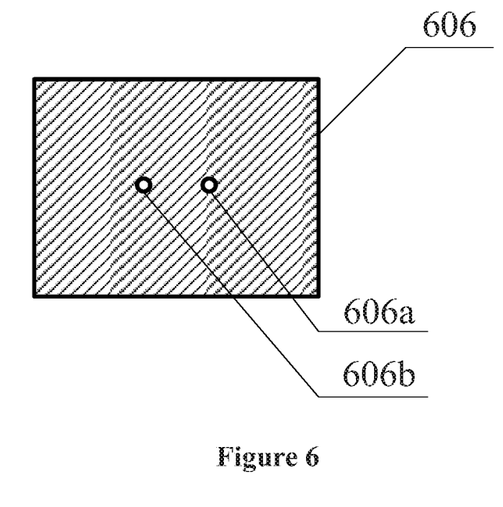
FIG. 6 is a schematic diagram showing an object plane mask for one embodiment of the ideal wavefront generator of the present invention.

FIG. 5 is a schematic diagram of the second embodiment of the ideal wavefront generator 6 of the present invention. The ideal wavefront generator 6 is alternatively composed of a third fiber 603, a fourth fiber 604, an imaging mirror set 605, and an object plane mask 606, with FIG. 6 showing a schematic diagram of the object plane mask 606; the input port of the third fiber 603 is the first input port 6A of the ideal wavefront generator 6, while the output port thereof is on an object plane of the imaging mirror set 605; the input port of the fourth fiber is the second input port 6B of the ideal wavefront generator 6, while the output port thereof is on an object plane of the imaging mirror set 605; the object plane mask 606 is on an image plane of the imaging mirror set 605; on the object plane mask 606 are arranged a first circular hole 606*a* and a second circular hole 606*b*; the first circular hole 606*a* is the first output port 6C of the ideal wavefront generator 6, while the second circular hole 606*b* is the second output port 6D of the ideal wavefront generator 6; the output port of the third fiber 603 is imaged on the second circular hole 606*b* via the imaging mirror set 605, while the output port of the fourth fiber 604 is imaged on the first circular hole 606*a* via the imaging mirror set 605; the third fiber 603 and the second fiber 604 is each either a single-mode fiber or a polarization maintaining fiber; the diameter $\Phi_o$ of either the first circular hole 606*a* or of the second circular hole 606*b* is smaller than the object diffraction limited resolution of the measured optical system 8, and satisfying $\Phi_o < \lambda/(2NA_o)$, wherein $\lambda$ is the wavelength of the light source, and $NA_o$ is the object numerical aperture of the measured optical system 8. The first circular hole 606*a* or the second circular hole 606*b* on the object plane mask 606 has a filtering effect on a light field, and since their diameter $\Phi_o$ is smaller than the object diffraction limited resolution of the measured optical system 8, their output light fields are each a standard spherical wave within the object numerical aperture $NA_o$ of the measured optical system 8. The input light of the first input port 6A or the second input port 6B is transformed into a standard spherical wave and is outputted from the first output port 6C or the second output port 6D respectively. The center distance between the first circular hole 606*a* and the second circular hole 606*b* on the object plane mask 606 is smaller than the diameter of the isoplanatic region of the measured optical system 8, and is greater than the ratio of the diameter of the image point dispersion speckle of the measured optical system 8 over the amplification factor thereof. For example, the diameter of the image point dispersion speckle of the measured optical system 8 being 1 μm, the diameter of the isoplanatic region being 50 μm, and the amplification factor being 1/5, then the center distance between the first circular hole 606*a* and the second circular hole 606*b* is smaller than 50 μm, and is greater than 5 μm.

Figure 7:
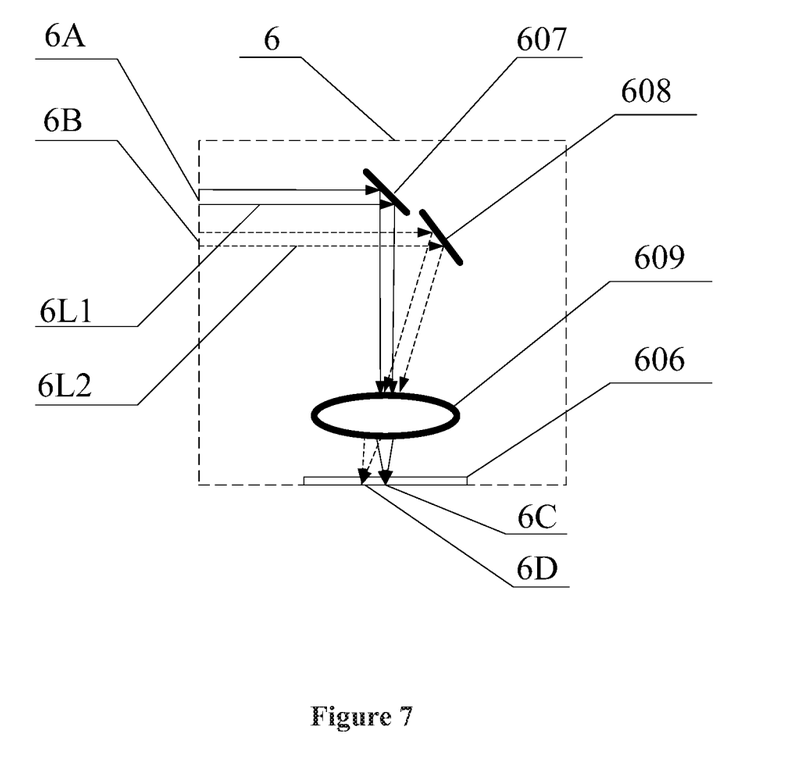
FIG. 7 is a schematic diagram showing the third embodiment of the ideal wavefront generator of the present invention.

FIG. 7 is a schematic diagram of the third embodiment of the ideal wavefront generator 6 of the present invention. The ideal wavefront generator 6 is composed of a first reflector 607, a second reflector 608, a focusing mirror set 609, and the object plane mask 606; two beams of collimated light, a first light beam 6L1, and a second light beam 6L2, are respectively inputted from the first input port 6A and the second input port 6B of the ideal wavefront generator 6; along the advancing direction of the first light beam 6L1 are successively the first reflector 607, the focusing mirror set 609, and the object plane mask 606; along the advancing direction of the second light beam 6L2 are successively the second reflector 608, the focusing mirror set 609, and the object plane mask 606; the object plane mask 606 is on a rear focus plane of the focusing mirror set 609; the first circular hole 606a on the object plane mask 606 is the first output port 6C of the ideal wavefront generator 6, while the second circular hole 606b thereon is the second output port 6D of the ideal wavefront generator 6; an angle exists between the first reflector 607 and the second reflector 608, so that the first light beam 6L1 is focused on the first output port 6C, while the second light beam 6L2 is focused on the second output port 6D. The structure and role of the object plane mask 606 are ditto to those on the second embodiment of the ideal wavefront generator 6. The input light from the first input port 6A or the second input port 6B is transformed into a standard spherical wave and is outputted from the first output port 6C or the second output port 6D respectively.

FIG. 8 shows multiple schematic diagrams of multiple embodiments of the image wavefront detection unit 9 of the present invention. The image wavefront detection unit 9 is composed of the image mask 901, the photoelectric sensor 902, and the support 903. The image mask 901 is situated on the image plane of the measured optical system 8; along the advancing direction of light and subsequent to the image mask 901 is arranged the photoelectric sensor 902; the support 903 is a mechanical component supporting the image mask 901 and the photoelectric sensor 902.

Figure 8A:
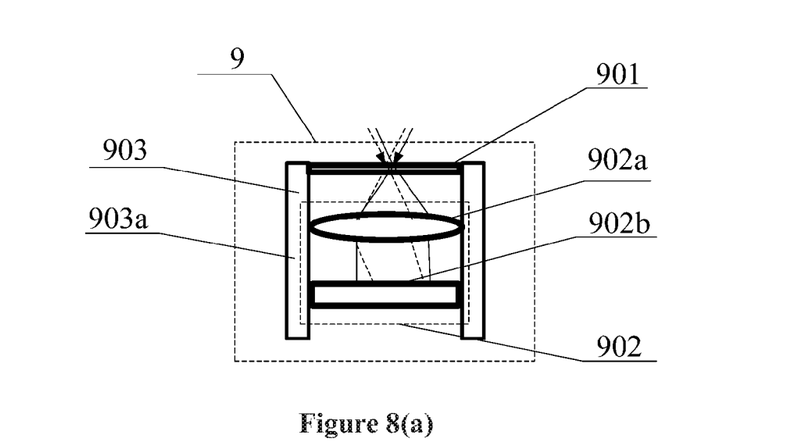
FIG. 8(a) is a schematic diagram showing the first embodiment of the image wavefront detection unit of the present invention.

The photoelectric sensor 902 as shown on FIG. 8(a) comprises a transform optical mirror set 902a and the two-dimensional detector 902b. The image mask 901 is situated on a front focus plane of the transform optical mirror set 902a, while the two-dimensional detector 902b is situated on a rear focus plane thereof. The transform optical mirror set 902a is an imaging-capable single lens, while the two-dimensional detector 902b is a CCD.

Figure 8B:
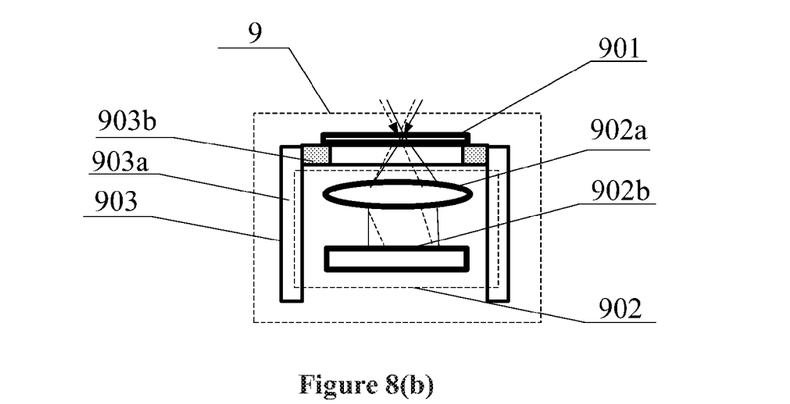
FIG. 8(b) is a schematic diagram showing the second embodiment of the image wavefront detection unit of the present invention.

The support 903 as shown on FIG. 8(b) comprises a fixed component 903a and a precision adjusting component 903b. The precision adjusting component 903b is supported on the fixed component 903a, the image mask is supported on the precision adjusting component 903b, and the photoelectric sensor 902 is supported on the fixed component 903a. The precision adjusting component 903b during system operation precision adjusts the position of the image mask 901 to realize precision alignment, while the fixed component 903a remains immovable during system operation. The precision adjusting component 903b employs an adjusting stage of piezoelectric ceramic with nano resolution and three tuning degrees of freedom XYZ.

The precision alignment is realized by means of adjusting the position of the image mask 901, so that one output port (the first output port 6C or the second output port 6D) of the ideal wavefront generator 6 is aligned with the center of the filtering circular hole 901a of the image mask 901 via an image point of the measured optical system 8, and an image point of the other output port (the second output port 6D or the first output port 6C) is situated within the transmittance band 901b of the image mask 901.

Figure 8C:
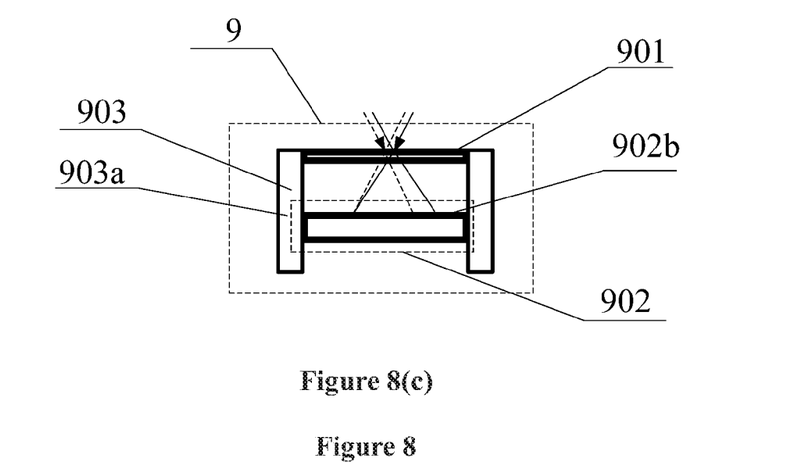
FIG. 8(c) is a schematic diagram showing the third embodiment of the image wavefront detection unit of the present invention.

The photoelectric sensor 902 as shown on FIG. 8(c) comprises solely the two-dimensional detector 902b. The two-dimensional detector 902b is disposed subsequent to the image mask 901 along the advancing direction of light, and is parallel to the image mask 901.

The support 903 as shown on FIG. 8(a) or FIG. 8(c) comprises only the fixed component 903a, with the precision adjusting component 903b being absent.

When the support 903 comprises the precision adjusting component 903b, the image precision adjusting stage 10 is a multi-degrees-of-freedom shifting stage or adjusting frame capable of adjusting the position of the image wavefront detection unit 9; by means of adjustment via the image precision adjusting stage 10, the output ports (the first output port 6C or the second output port 6D)of the ideal wavefront generator 6 are aligned with the image mask 901 via an image point of the measured optical system 8, that is, enter the precision adjustment range of the precision adjusting component 903b of the support 903.

When the support 903 comprises only the fixed component 903a, but not the precision adjusting component 903b, the precision alignment is realized via the image precision adjusting stage 10 solely.

Figure 9:
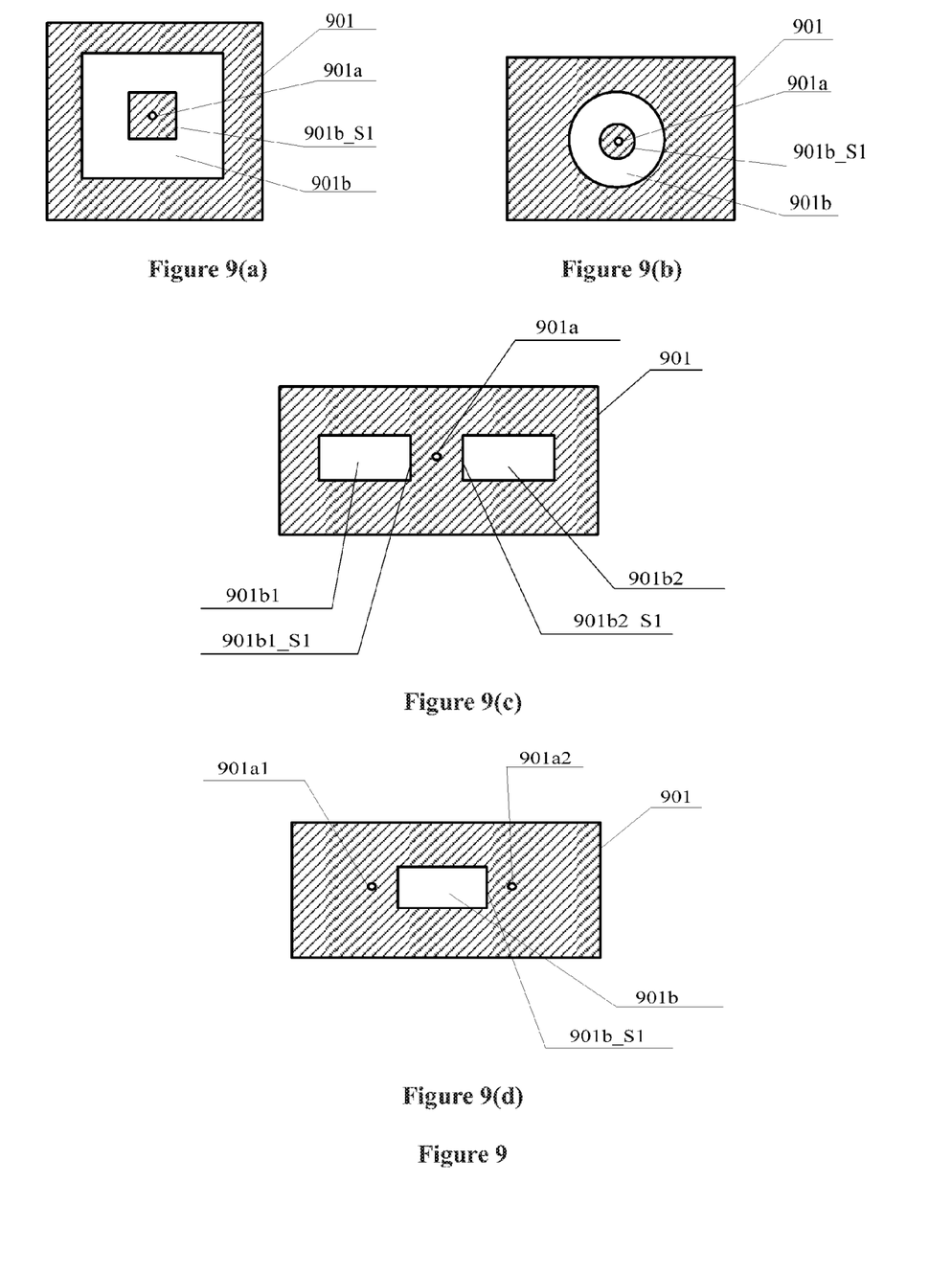

FIG. 9 shows multiple schematic diagrams of multiple embodiments of the image mask 901 of the present invention. The image mask 901 as is shown on FIG. 9(a) or FIG. 9(b) comprises a transmittance band 901b and a filtering circular hole 901a; the filtering circular hole 901a is a transmittance hole with a diameter smaller than the object diffraction limited resolution of the measured optical system 8, and satisfying $\Phi_i<\lambda/(2NA_o)$, where $\lambda$ is the wavelength of the light source, and $NA_i$ is the object numerical aperture of the measured optical system 8. The transmittance band 901b is a transmittance region for the image dispersion speckle to pass without blockade through the first output port 6C or the second output port 6D and be imaged via the measured optical system 8. The transmittance band 901b as is shown on FIG. 9(a) is in a form of a square with a geometrically similar and smaller one cut out at its center, while the one as is shown on FIG. 9(b) is in the form of a circular ring. The transmittance band 901b and the filtering circular hole 901a regions in the image mask 901 are light transparent, while the other regions thereof are light opaque with a shielding layer. The filtering circular hole 901a is situated at the center of the opaque region within the inner boundary of the transmittance band 901b. *The transmittance band 901b has two boundaries, with the inner boundary 901$b_{13}$ S1 being more proximate to the filtering circular hole 901a, and the shortest distance from the center of the filtering circular hole 901a to the inner boundary 901$b_{13}$ S1 being slightly greater than the radius of the image dispersion speckle of the measured optical system 8.*

The shielding layer is a layer made of chromium, aluminum or other metals, or a Mo/Si multi-layer membrane which substantially attenuates light passing therethrough.

As shown on FIG. 9(c), the transmittance band 901b of the image mask 901 is composed of two separated regions, a first transmittance band region 901b1, and a second transmittance band region 901b2, with the image mask 901 further comprising a filtering circular hole 901a; the characteristic of the filtering circular hole 901a is identical to those of its counterparts as are shown on FIG. 9(a) and FIG. 9(b); both the first transmittance band region 901b1 and the second transmittance band region 901b2 are each a transmittance region in quadrangle for the image dispersion speckle to pass without blockade through the first output port 6C or the second output port 6D and be imaged via the measured optical system 8. The first transmittance band region 901b1, the second transmittance band region 901b2 and the filtering circular hole 901a in the image mask 901 are light transparent, while the other regions thereof are light opaque with a shielding layer. The first transmittance band region 901$b$1 and the second transmittance band region 901$b$2 are respectively on the left and right side of the filtering circular hole 901$a$. Both the first transmittance band region 901$b$ and the second transmittance band region 901$b$2 each has only one boundary, being respectively the 901$b1_{13}$ 1 S1 and 901$b2_{13}$ S1, while the shortest distances from the center of the filtering circular hole 901$a$ to the boundaries 901$b1_{13}$ 1 S1 and 901$b2_{13}$ S1 are both slightly greater than the radius of the image dispersion speckle of the measured optical system 8.

The image mask 901 as is shown on FIG. 9($d$) comprises a transmittance band 901$b$, a first filtering circular hole 901$a$1, and a second filtering circular hole 901$a$2; the characteristics of the first filtering circular hole 901$a$1 and the second filtering circular hole 901$a$2 is identical to those of their counterparts as are shown on FIG. 9($a$) and FIG. 9($b$); the transmittance band 901$b$ is a transmittance region in quadrangle for the image dispersion speckle to pass without blockade through the first output port 6C or the second output port 6D and be imaged via the measured optical system 8. The transmittance band 901$b$, the first filtering circular hole 901$a$1 and the second filtering circular hole 901$a$2 in the image mask 901 are regions transparent to light, while the other regions are opaque to light with a shielding layer. The first filtering circular hole 901$a$1 and the second filtering circular hole 901$a$2 are respectively on the left and right side of the transmittance band 901$b$. The transmittance band 901$b$ has only one boundary 901$b$-S1, with the shortest distances thereto from the first filtering circular hole 901$a$1 and the second filtering circular hole 901$a$2 both being slightly greater than the radius of the image dispersion speckle of the measured optical system 8.

Figure 10:
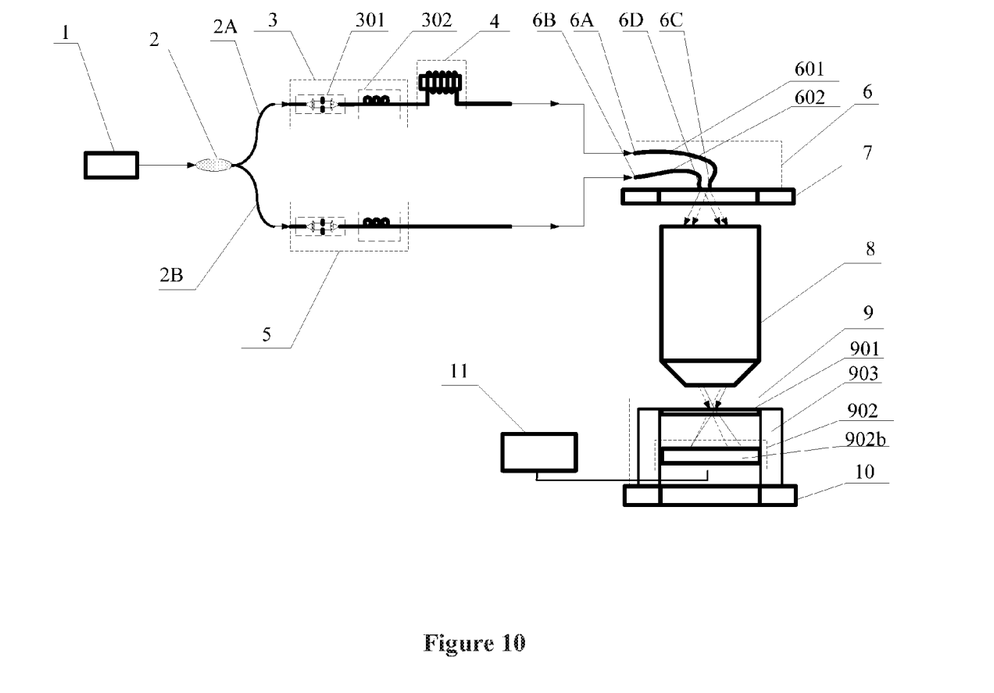
FIG. 10 is a schematic diagram showing one embodiment of the point diffraction interferometric wavefront aberration measuring device of the present invention.

FIG. 10 is a schematic diagram of an embodiment of the point diffraction interferometric wavefront aberration measuring device of the present invention. The light source 1 is a laser with single mode fiber output. The optical splitter 2 is an optical fiber coupler. The first light intensity and polarization regulator 3 is composed of the adjustable attenuator 301 and the polarization controller 302, with both the adjustable attenuator 301 and the polarization controller 302 being each a fiber component, and the adjustable attenuator 301 being arranged prior to the polarization controller 302 along the advancing direction of light; the adjustable attenuator 301 is composed of a fiber, a fiber collimating lens, an adjustable diaphragm, a fiber coupling lens, and another fiber, which are successively connected. The polarization controller 302 is composed of a fiber quarter wave plate, a fiber half wave plate, and another fiber quarter wave plate, which are successively connected. The phase shifter 4 adopts the structure as is shown on FIG. 3($a$). The second light intensity and polarization regulator 5 is structurally identical to the first light intensity and polarization regulator 3. The light path adjustable light path 2A and the light-path-fixed light path 2B are fiber light paths. The ideal wavefront generator 6 adopts the structure as is shown on FIG. 4. The object precision adjusting stage 7 is implemented by means of a six dimensional precision shifting stage with three linear degrees of freedom X, Y, and Z, and three rotational degrees of freedom X$\theta$, Y$\theta$, and Z$\theta$. The measured optical system 8 is a reduced projection lens. The image wavefront detection unit 9 adopts the structure as is shown on FIG. 8($c$); the image mask 901 adopts the structure as is shown on FIG. 9($b$), with the advantage of adoption of a circular ring by the transmittance band 901$b$ being reduced difficulty of alignment in step 2). The image precision adjusting stage 10 is also a six dimensional precision shifting stage with three linear degrees of freedom X, Y, and Z, and three rotational degrees of freedom X$\theta$, Y$\theta$, and Z$\theta$. The data processing unit 11 is a computer for storage of interferograms, and for obtaining wavefront aberration via processing the interferograms.

Figure 11:
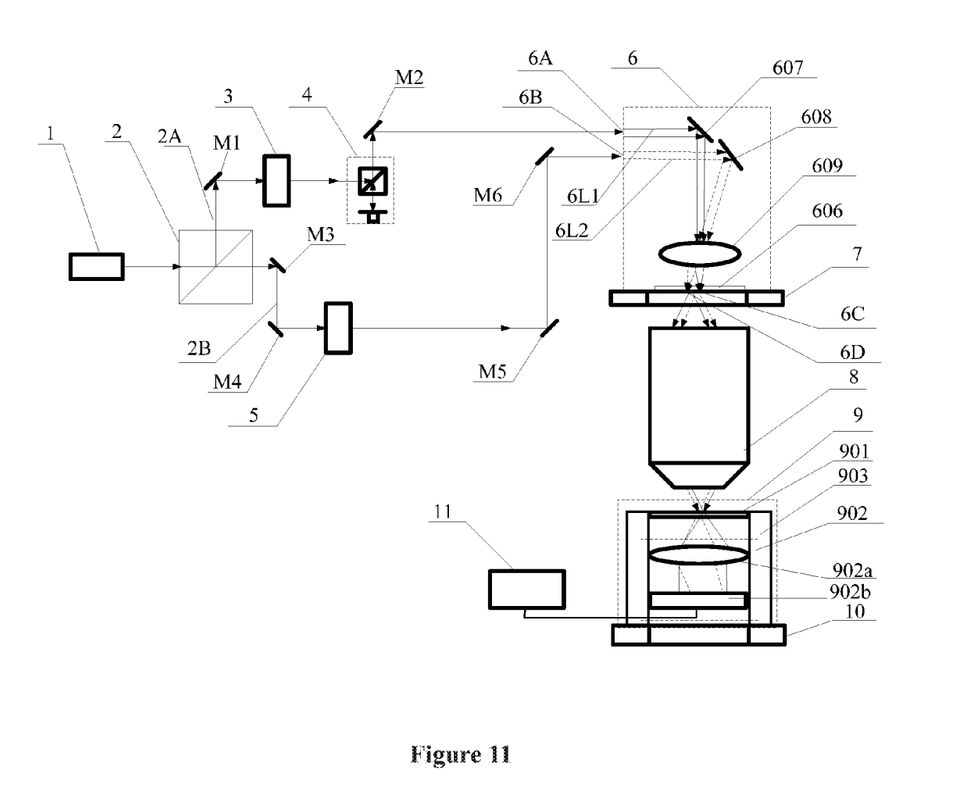
FIG. 11 is a schematic diagram showing another embodiment of the point diffraction interferometric wavefront aberration measuring device of the present invention.

FIG. 11 is a schematic diagram showing the second embodiment of the point diffraction interferometric wavefront aberration measuring device of the present invention. The optical source 1 is a laser with free space parallel light output. The optical splitter 2 is a beam splitter lens. The first light intensity and polarization regulator 3 is a rotating glass with different attenuating foils plated on its different sector regions, and which only regulates light power. The phase shifter 4 adopts the structure as is shown on FIG. 3($b$). The second light intensity and polarization regulator 5 is an adjustable diaphragm which only regulates light power. The light path adjustable light path 2A and the light-path-fixed light path 2B are free space light paths; the reflectors M1 and M2 on the light path adjustable light path 2A, and the reflectors M3, M4, M5, and M6 on the light-path-fixed light path 2B are merely employed for changing transmission direction of light. The ideal wavefront generator 6 adopts the structure as is shown on FIG. 7. The image wavefront detection unit 9 adopts the structure as is shown on FIG. 8($a$); the image mask 901 adopts the structure as is shown on FIG. 9($a$). Those that are not mentioned follow the first embodiment on FIG. 10.

A detecting method employing the point diffraction interferometric wavefront aberration measuring device as is described on FIG. 10 or FIG. 11 for detection of the wavefront aberration of the measured optical system is characterized to comprise the following steps:

1) moving the object precision adjusting stage 7 so that the first output port 6C or the second output port 6D of the ideal wavefront generator 6 is situated in a position of a field of view point for detection of the measured optical system 8;

2) moving the image precision adjusting stage 10 and conducting a precision alignment, so that the image point of the first output port 6C of the ideal wavefront generator 6 is aligned with the center of the filtering circular hole 901$a$ of the image mask 901, and the image point of the second output port 6D is situated inside the transmittance band 901$b$ of the image mask 901;

3) adjusting the first light intensity and polarization regulator 3 and the second light intensity and polarization regulator 5, so that the intensity of the interferogram collected by the photoelectric sensor 902 reaches 0.6-0.9 of the saturation intensity of the photoelectric sensor 902, and the interference visibility thereof reaches above 0.6; the phase shifter 4 and the photoelectric sensor 902 repeat for 5 times of phase shifting for a phase shift phase $\pi/2$ and collecting an interferogram, which are successively $\pi/2$ phase shift phase apart, and are denoted as Ia1, Ia2, Ia3, Ia4, and Ia5; conducting phase extraction on the sequence of the interferograms according to the algorithm as shown on the expression (4) to obtain a wrapper phase distribution WR$_a$ and conducting phase-unwrapping on WR$_a$ to obtain a phase distribution W$_a$;

$$WR_a = \tan^{-1}\left(\frac{2(I_{a4} - I_{a2})}{I_{a1} - 2I_{a3} + I_{a5}}\right) \quad (4)$$

4) moving the image precision adjusting stage 10 and conducting a precision alignment, so that the image point of the second output port 6D of the ideal wavefront generator 6 is aligned with the center of the filtering circular hole 901a of the image mask 901, and the image point of the first output port 6C is situated inside the transmittance band 901b of the image mask 901;

5) adjusting the first light intensity and polarization regulator 3 and the second light intensity and polarization regulator 5, so that the intensity of the interferogram collected by the photoelectric sensor 902 reaches 0.6-0.9 of the saturation intensity of the photoelectric sensor 902, and the interference visibility thereof reaches above 0.6; the phase shifter 4 and the photoelectric sensor 902 repeat for 5 times of phase shifting for a phase shift phase π/2 and collecting an interferogram, to obtain a sequence of 5 interferograms, which are successively π/2 phase shift phase apart, and are denoted as Ib1, Ib2, Ib3, Ib4, and Ib5; conducting phase extraction on the sequence of the interferograms according to the algorithm as shown on the expression (5) to obtain a wrapper phase distribution $WR_b$ and conducting phase-unwrapping on $WR_b$ to obtain a phase distribution $W_b$;

$$WR_b = \tan^{-1}\left(\frac{2(I_{b4} - I_{b2})}{I_{b1} - 2I_{b3} + I_{b5}}\right) \quad (5)$$

6) calculating the wave aberration W of the measured optical system 8 at the field of view point via the expression $W = \frac{1}{2}(W_a - W_b)$, and calculating the system error of the point diffraction interferometric wavefront aberration measuring device via the expression $W_{sys} = \frac{1}{2}(W_a + W_b)$.

The algorithm of the phase extraction is expressed in arctangent, with the phase distribution truncated into multiple regions in a range of 2π, called wrapped phases; to finally obtain the continuous phase data, the multiple regions of the truncated phases are spliced and expanded to be a continuous phase, the procedure being named as phase unwrapping.

The above described embodiments have the following advantages: high fringe visibility, calibration and elimination of system errors in a complete measured range, averaging effect of the measurement procedure, and simple detection steps.

The measuring device of the present invention has simple detecting steps, with the measuring procedure having an average effect, and is advantageous in that the calibration and elimination of the system error may be realized for a complete numerical aperture.

We claim:

1. A device for measuring point diffraction interferometric wavefront aberration, comprising:
   an optical source,
   an optical splitter,
   a first light intensity and polarization regulator,
   a phase shifter,
   a second light intensity and polarization regulator,
   an ideal wavefront generator having a first input port, a second input port, a first output port, and a second output port,
   an object precision adjusting stage,
   a measured optical system having an object plane and an image plane, the image plane being on an image side,
   an image wavefront detection unit having an image mask and a photoelectric sensor, the photoelectric sensor comprising a two-dimensional detector,
   an image precision adjusting stage, and
   a data processing unit,
   wherein the optical splitter is placed along an advancing direction of an optical path of an output light from the optical source;
   the optical splitter splits the output light into a light path adjustable light path and a light-path-fixed light path;
   the first light intensity and polarization regulator and the phase shifter are arranged along the light path adjustable light path, followed by the first input port of the ideal wavefront generator, and the first light intensity and polarization regulator is placed either prior to or subsequent to the phase shifter;
   the second light intensity and polarization regulator is arranged along the light-path-fixed light path, followed by the second input port of the ideal wavefront generator;
   the first output port and the second output port of the ideal wavefront generator are on the object plane of the measured optical system;
   the ideal wavefront generator is supported and precision positioned by the object precision adjusting stage;
   the image wavefront detection unit is situated on the image side of the measured optical system, the image mask of the image wavefront detection unit is situated on the image plane of the measured optical system, and the two-dimensional detector of the photoelectric sensor is situated subsequent to the image mask along the advancing direction of the light;
   the image wavefront detection unit is supported and precision positioned by the image precision adjusting stage;
   output signal of the image wavefront detection unit is inputted to the data processing unit;
   wherein the ideal wavefront generator is an optical component transforming a light of a first input port and a second input port thereof to a standard spherical wave in a scope of an object numerical aperture of the measured optical system, and the standard spherical wave is subsequently outputted respectively from a first output port and a second output port thereof; and
   a center distance $s_o$ between the first output port and the second output port of the ideal wavefront generator is smaller than a diameter of an isoplanatic region of the measured optical system and is greater than a ratio of a diameter of an image point dispersion speckle of the measured optical system over an amplification factor thereof.

2. The device for measuring point diffraction interferometric wavefront aberration according to claim 1, wherein the first light intensity and polarization regulator comprises an adjustable attenuator and a polarization controller, and the adjustable attenuator is connected prior to or subsequent to the polarization controller along the advancing direction of light.

3. The device for measuring point diffraction interferometric wavefront aberration according to claim 1, wherein the first light intensity and polarization regulator comprises a polarization analyzer and a rotary stage; the rotary stage rotates the polarization analyzer to change the direction of the transmission axis of the polarization analyzer, thereby changing the polarization and light intensity of the output light.

4. The device for measuring point diffraction interferometric wavefront aberration according to claim 1, wherein the first light intensity and polarization regulator comprises a polarization controller and a polarization analyzer; the polarization controller and the polarization analyzer are successively connected along the advancing direction of light; by adjusting the polarization of light via the polarization controller, the light intensity of the polarization analyzer is changed.

5. The device for measuring point diffraction interferometric wavefront aberration according to claim 1, wherein the first light intensity and polarization regulator comprises an adjustable attenuator, and only adjusts light power along the light path.

6. The device for measuring point diffraction interferometric wavefront aberration according to claim 1, wherein the phase shifter comprises a columnar piezoelectric ceramic and a single-mode fiber loop winding thereon; by changing the driving voltage of the columnar piezoelectric ceramic, the diameter of the columnar piezoelectric ceramic changes, thus the length of the single-mode fiber loop and thereby the light path is changed.

7. The device for measuring point diffraction interferometric wavefront aberration according to claim 1, wherein the phase shifter comprises a beam splitter prism, a reflector, and a piezoelectric ceramic; along the direction of the incident light is arranged the beam splitter prism, and the reflector is arranged in the direction of the reflection light of the beam splitter prism; light reflected by the reflector comes out via the beam splitter prism; as the reflector is mounted on the piezoelectric ceramic, by changing the driving voltage of the piezoelectric ceramic, the length of the piezoelectric ceramic is changed to move the reflector, thus changing the light path.

8. The device for measuring point diffraction interferometric wavefront aberration according to claim 1, wherein the image wavefront detection unit comprises an image mask, a photoelectric sensor, and a support, and the image mask is situated on an image plane of the measured optical system; along an advancing direction of light and subsequent to the image mask is arranged the photoelectric sensor, and the support is a mechanical component supporting the image mask and the photoelectric sensor.

9. The device for measuring point diffraction interferometric wavefront aberration according to claim 8, wherein the photoelectric sensor comprises a transform optical mirror set and two-dimensional detector; the image mask is situated on a front focus plane of the transform optical mirror set, the two-dimensional detector is situated on a rear focus plane of the transform optical mirror set, and the transform optical mirror set is an imaging-capable single lens, while the two-dimensional detector is a CCD.

10. The device for measuring point diffraction interferometric wavefront aberration according to claim 9, wherein the support consists of a fixed component, and the precision adjusting component is absent.

11. The device for measuring point diffraction interferometric wavefront aberration according to claim 8, wherein the support comprises a fixed component and a precision adjusting component; the precision adjusting component is supported on the fixed component, the image mask is supported on the precision adjusting component, and the photoelectric sensor is supported on the fixed component.

12. The device for measuring point diffraction interferometric wavefront aberration according to claim 8, wherein the photoelectric sensor comprises a single two-dimensional detector; the two-dimensional detector is disposed subsequent to the image mask along the advancing direction of light, and is parallel to the image mask.

13. The device for measuring point diffraction interferometric wavefront aberration according to claim 12, wherein the support consists of a fixed component, and the precision adjusting component is absent.

14. The device for measuring point diffraction interferometric wavefront aberration according to claim 1, wherein the image mask comprises a transmittance band and a filtering circular hole; the filtering circular hole is a transmittance hole with a diameter smaller than the object diffraction limited resolution of the measured optical system and satisfying $\Phi_i < \lambda/(2NA_o)$, where $\lambda$ is the wavelength of the light source, and $NA_i$ is the object numerical aperture of the measured optical system; the transmittance band is a transmittance region for the image dispersion speckle to pass without blockade through the first input port or the second input port and is imaged via the measured optical system.

15. The device for measuring point diffraction interferometric wavefront aberration according to claim 14, wherein the transmittance band is in a form of a square with a geometrically similar and smaller one cut out at its center.

16. The device for measuring point diffraction interferometric wavefront aberration according to claim 14, wherein the transmittance band is in a form of circular ring.

17. The device for measuring point diffraction interferometric wavefront aberration according to claim 14, wherein the transmittance band and the filtering circular hole regions in the image mask are light transparent, while other regions thereof are light opaque with a shielding layer; the filtering circular hole is situated at a center of the opaque region within the inner boundary of the transmittance band; the transmittance band has two boundaries, with the inner boundary being more proximate to the filtering circular hole and a shortest distance from the center of the filtering circular hole to the inner boundary being slightly greater than the radius of the image dispersion speckle of the measured optical system.

18. The device for measuring point diffraction interferometric wavefront aberration according to claim 14, wherein the transmittance band comprises two separated regions, a first transmittance band region and a second transmittance band region, with the image mask further comprising a filtering circular hole; both the first transmittance band region and the second transmittance band region are each a transmittance region in quadrangle for the image dispersion speckle to pass without blockade through the first input port or the second input port and be imaged via the measured optical system.

19. The device for measuring point diffraction interferometric wavefront aberration according to claim 14, wherein the image mask comprises a transmittance band, a first filtering circular hole, and a second filtering circular hole; the transmittance band is a transmittance region in quadrangle for the image dispersion speckle to pass without blockade through the first output port or the second output port and be imaged via the measured optical system; the transmittance band, the first filtering circular hole, and the second filtering circular hole in the image mask are regions transparent to light, while the other regions are opaque to light with a shielding layer.

20. A method for detecting a wavefront aberration of the measured optical system according to claim 1, comprising
moving the object precision adjusting stage so that the first output port or the second output port of the ideal wavefront generator is situated in a position of a field of view point for detection of the measured optical system;
moving the image precision adjusting stage and conducting a precision alignment, so that an image point of the first output port of the ideal wavefront generator is aligned with a center of a filtering circular hole of an image mask, and an image point of the second output port is situated inside a transmittance band of the image mask;

adjusting the first light intensity and polarization regulator and the second light intensity and polarization regulator, so that an intensity of an interferogram collected by a photoelectric sensor reaches 0.6-0.9 of a saturation intensity of the photoelectric sensor, and an interference visibility thereof reaches above 0.6; phase shifting for a phase shift phase δ via the phase shifter, with the photoelectric sensor collecting an interferogram, phase shifting for a second time for a phase shift phase δ via the phase shifter, with the photoelectric sensor collecting another interferogram, and repeating form times to obtain a sequence of m interferograms: Ia1, Ia2, ..., Iam; conducting phase extraction and phase-unwrapping on the sequence of the m interferograms to obtain a phase distribution $W_a$;

moving the image precision adjusting stage and conducting a precision alignment, so that the image point of the second output port of the ideal wavefront generator is aligned with the center of the filtering circular hole of the image mask, and the image point of the first output port is situated inside the transmittance band of the image mask;

adjusting the first light intensity and polarization regulator and the second light intensity and polarization regulator, so that an intensity of yet another interferogram collected by the photoelectric sensor reaches 0.6-0.9 of the saturation intensity of the photoelectric sensor, and an interference visibility thereof reaches above 0.6; phase shifting for a phase shift phase δ for m times via the phase shifter, with each time the photoelectric sensor collecting an interferogram, to obtain a sequence of m interferograms: Ib1, Ib2, ..., Ibm; conducting phase extraction and phase-unwrapping on the sequence of the m interferograms Ib1, Ib2, ..., Ibm to obtain a phase distribution $W_b$; and calculating a wave aberration W of the measured optical system at the field of view point via an expression $W=\frac{1}{2}(W_a-W_b)$, and calculating a system error of the point diffraction interferometric wavefront aberration measuring device via an expression $W_{SYS}=\frac{1}{2}(W_a+W_b)$.

* * * * *